United States Patent [19]

Kinder et al.

[11] 4,217,524
[45] Aug. 12, 1980

[54] METHOD AND STRUCTURE FOR GENERATING REPRESENTATIONS OF REPETITIVE ELECTRICAL WAVEFORMS

[75] Inventors: George W. Kinder, Columbus; Harry Winter, Granville, both of Ohio

[73] Assignee: Bell Telephone Laboratories, Incorporated, Murray Hill, N.J.

[21] Appl. No.: 904,769

[22] Filed: May 11, 1978

[51] Int. Cl.² .................. H01J 29/70; H01J 29/72
[52] U.S. Cl. ............................. 315/364; 315/367
[58] Field of Search ............ 315/364, 367; 340/722, 340/741, 753; 324/113, 115, 121 R

[56] References Cited

U.S. PATENT DOCUMENTS

| | | | |
|---|---|---|---|
| 3,156,913 | 11/1964 | Crocker et al. | 340/347 |
| 3,859,556 | 1/1975 | Schumann | 315/367 |
| 3,922,666 | 11/1975 | Inami et al. | 340/753 |
| 4,069,452 | 1/1978 | Conway et al. | 324/103 P |
| 4,083,042 | 4/1978 | Kushin et al. | 340/753 |

OTHER PUBLICATIONS

Huck et al, *A Strobing Voltmeter*, Western Electric Co. Technical Digest No. 13, Jan. 1969, pp. 21–22
Dendinger, *High-Speed Analog Sampler Uses Only Two IC's*, EDN Magazine, 5-20-77, pp. 128–129.

*Primary Examiner*—Theodore M. Blum
*Attorney, Agent, or Firm*—Jerry W. Herndon

[57] ABSTRACT

The invention is a method and structure for generating representations of repetitive electrical waveforms by sampling the magnitude of a plurality of points on the waveform. The sampling method is characterized by progressively forming an approximation of the magnitude of each waveform point during a plurality of repetitions of the waveform. In accordance with one feature of an illustrative embodiment of the invention, the magnitude of the waveform at each of the points is formed by successively comparing during a plurality of repetitions of the waveform the waveform magnitude to the magnitude of a reference signal associated with the point and by adjusting the magnitude of the reference signal after each comparison in accordance with the result of comparison. The invention includes circuit structure for performing the foregoing method.

19 Claims, 6 Drawing Figures

METHOD AND STRUCTURE FOR GENERATING REPRESENTATIONS OF REPETITIVE ELECTRICAL WAVEFORMS

TECHNICAL FIELD

This invention relates to signal sampling methods and circuits for repetitive electrical waveforms.

BACKGROUND ART

It has been a continuing problem in the art to develop simple and inexpensive methods of producing representations, or images, of repetitive, wide-bandwidth signals. The problem is exemplified in the oscilloscope art where analog oscilloscopes, for example, may operate on input waveforms having a bandwidth of approximately 500 or less megahertz, but only at high cost. This means that inexpensive analog oscilloscopes are limited to use with lower frequency waveforms.

The bandwidth characteristics of oscilloscopes was significantly advanced during the 1950s by the introduction of the sampling oscilloscope which can be generally classified as an instrument for generating representations of repetitive waveforms. The conventional sampling oscilloscope uses analog structure to store an analog potential proportional to the magnitude of a waveform point. A different waveform point is examined on each successive repetition of a repetitive waveform and the stored potentials of the sampled points are used to vertically deflect a cathode ray tube beam along a horizontal axis corresponding to time to produce an overall waveform representation or image. Low charge-density storage, fast switching diodes, operated at the appropriate time in relation to an occurrence of the waveform, are used to define each waveform point being sampled. Sampling pulses operate the diodes at the appropriate times. This, in turn, allows a storage circuit to charge to a potential proportional to the magnitude of the waveform at the sampled point.

The width of the sampling pulses determines the bandwidth characteristics of such analog sampling circuits. Typically, fast snap-back diodes are used to generate narrow pulses in order to achieve bandwidth characteristics having a current upper limit of about 2 gigahertz.

Although conventional analog sampling circuits, such as described above, are highly satisfactory and useful, the circuitry required to obtain such bandwidth characteristics is highly sophisticated and expensive. Thus, it is a continuing problem to find a sampling method and structure having wide-bandwidth characteristics and yet requiring nonsophisticated and inexpensive circuitry.

DISCLOSURE OF THE INVENTION

The invention is a method and structure for generating representations of repetitive electrical waveforms by sampling the magnitude of a plurality of points on the waveform. The sampling method is characterized by progressively forming an approximation of the magnitude of each waveform point during a plurality of repetitions of the waveform.

In accordance with one feature of the invention, the magnitude of the waveform at each of the points is formed by successively comparing the waveform magnitude to the magnitude of a reference signal associated with the point on a plurality of repetitions of the waveform and by adjusting the magnitude of the reference signal after each comparison in accordance with the result of comparison.

The invention includes circuit structure for performing the foregoing method.

The invention has application to both repetitive waveforms in which the repetitions are substantially identical and in which the signal in successive waveform occurrences is varying slowly with respect to each other and the waveform occurrence rate. Therefore, throughout this specification and in the claims, the use of the word repetition is intended to encompass situations in which the signal content of successive waveform occurrences is substantially identical or is slowly varying with respect to the sampling rate and each other. It is also understood that waveform repetitions need not be periodic to apply the principles of our invention.

Using standard, off-the-shelf digital components to be described, we have been able by digital techniques to produce accurately images of repetitive waveforms having bandwidths of about 500 megahertz and at a cost remarkably below that of wide bandwidth conventional analog and analog sampling circuits. The upper bandwidth limit obtainable by using our invention is not known, but it is believed that the limit may be substantially furthered by the tailored design of digital components with an eye toward maximizing the beneficial parameters of the invention.

The embodiment of the invention disclosed herein also advantageously requires less power to operate than other types of sampling circuits and thus lends itself to portability. The disclosed embodiment also has the inherent ability to produce both analog and binary characterizations of waveform samples. The binary characterizations are particularly suited for storage, data processing or transmission over a medium such as a telephone line. This, in turn, enhances its portability as well as its application to a wide range of uses.

DESCRIPTION OF THE PRIOR ART

Figure 1:
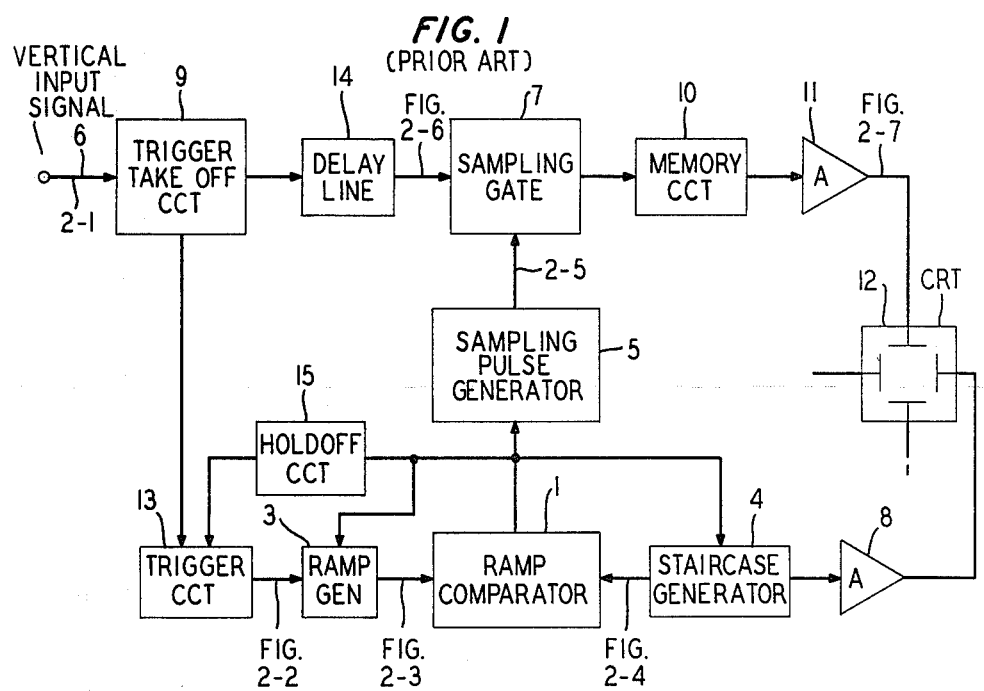
FIG. 1 contains a block diagram of the essential elements of a conventional analog sampling oscilloscope.
Figure 2:
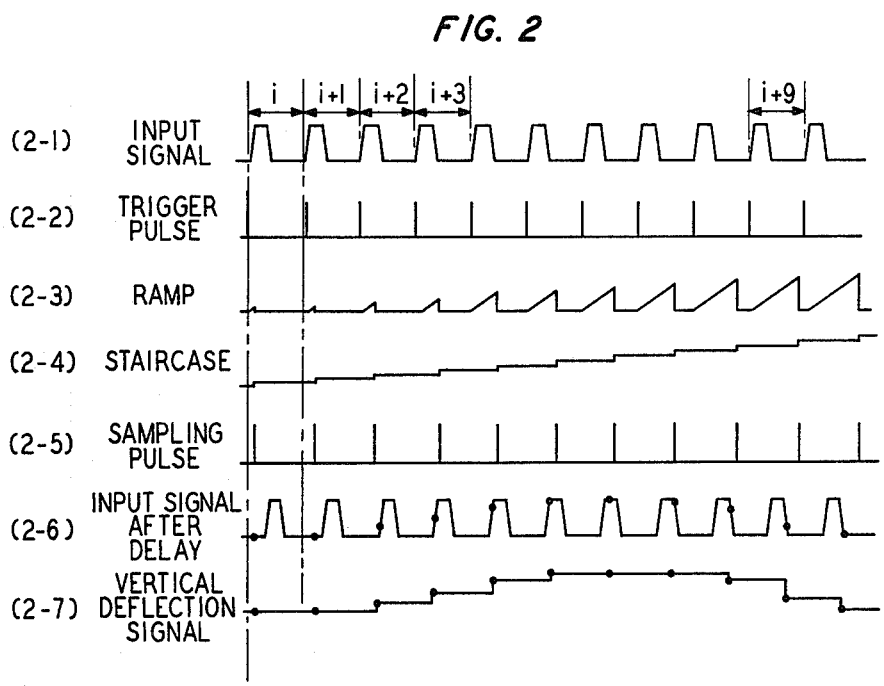
FIG. 2 shows a plurality of typical electrical signals present at prescribed points in the block diagram of FIG. 1.

The block diagram of FIG. 1 is typical of the structure of conventional analog sampling oscilloscopes. A brief discussion of the operation of such a circuit was mentioned earlier. In more detail, the circuit operates as follows. An illustrative repetitive waveform such as shown in FIG. 2-1 is assumed to be present at input lead 6. The waveform consists of a repeating pulse. The marked intervals i, i+1, etc., each correspond to what is here termed a waveform repetition. The input signal is applied to trigger take-off circuit 9 which extends part of the input signal to trigger circuit 13. The input signal is also extended by trigger take-off circuit 9 to a delay line 14 which, after a prescribed delay, applies the input signal to an input of sampling gate 7.

Trigger circuit 13 is typically adjusted by an operator to generate a trigger pulse at a desired rising or falling input signal magnitude. It is assumed here that trigger circuit 13 generates a trigger pulse, such as shown in FIG. 2-2, at the initial rising edge of each repetitive pulse of the input signal.

Figure 3:
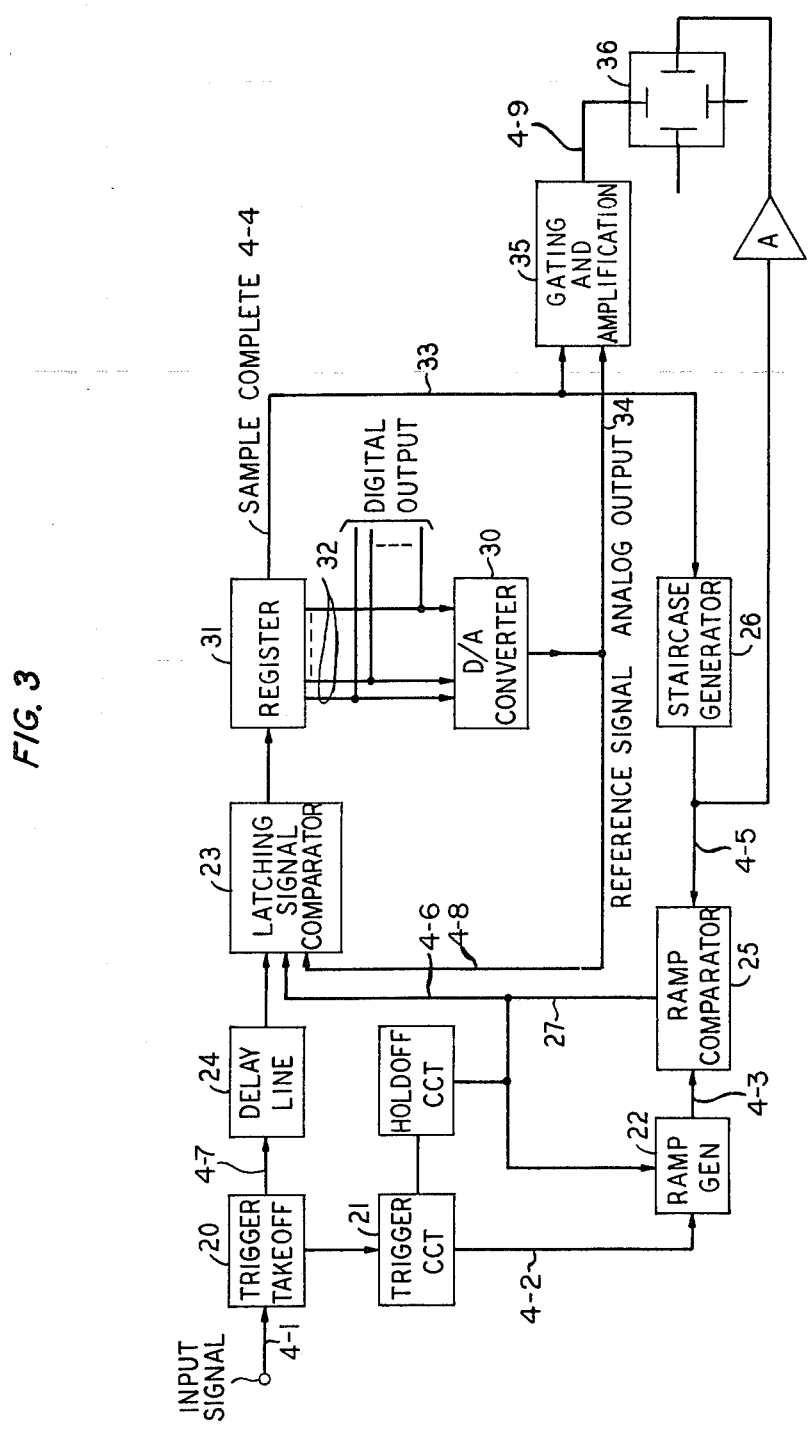
FIG. 3 discloses a block diagram of an illustrative sampling oscilloscope having triggering and signal comparison circuits designed in accordance with one feature of our invention for producing representations of an input repetitive waveform. This exemplary circuit forms samples of the magnitude of a plurality of points on the waveform by successively comparing, on a prescribed number of repetitions of a waveform, the magnitude of the waveform at one point to a reference signal whose magnitude is adjusted after each comparison, and by repeating the comparing operations with respect to other points on the waveform during subsequent waveform repetitions.
Figure 4:
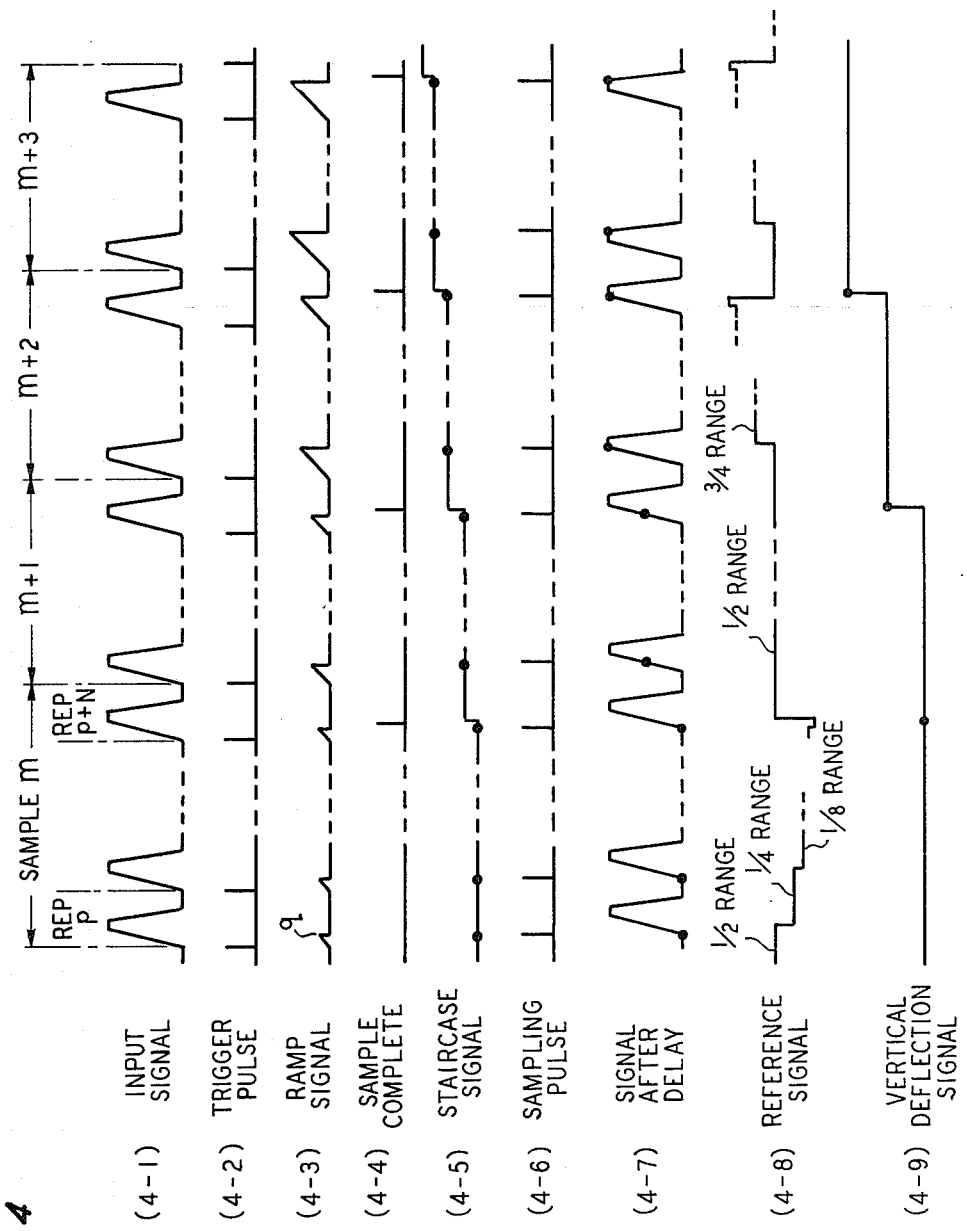
FIG. 4 discloses a plurality of illustrative signals present at prescribed points in the circuit of FIG. 3.

Responsive to each trigger pulse, ramp generator 3 generates a ramp signal such as shown in FIG. 2-3. The ramp signal is applied to one input of ramp comparator 1. At the same time, a steady staircase level signal illustrated in FIG. 2-4, is applied to a second input of comparator 1 from staircase generator 4. When the magnitude of the ramp signal equals the magnitude of the staircase signal, ramp comparator 1 generates a signal to activate sampling pulse generator 5. Staircase generator 4 also receives the signal from ramp comparator 1 and responsive thereto steps its staircase output signal to ramp comparator 1 to the next staircase level as shown in FIG. 2-4. The sampling pulse generated by sampling pulse generator 5 defines the approximate point on the delayed waveform from delay line 14 that is to be sampled during this waveform repetition. The new staircase level defines a new point to be sampled on the next waveform repetition.

As seen in FIG. 2-6, which shows the delayed input signal, the sampled point on waveform repetition i corresponds to a point on the delayed waveform occurring shortly before beginning of the rising edge of the pulse. The magnitude of the signal corresponding to this point is applied by sampling gate 7 to memory circuit 10 during the duration of the sampling pulse and, as explained above, the stored value in memory circuit 10 is applied to CRT 12 at an appropriate time thereafter.

Responsive to the signal from ramp comparator 1, ramp generator 3 terminates the ramp signal, as shown in FIGS. 2-3, in anticipation of beginning a new ramp signal during the next repetition of the waveform. A hold-off circuit 15 also receives the signal from ramp comparator 1 and operates in response to control trigger circuit 13 so that no new trigger signal is generated on a successive waveform repetition until the ramp generator 3 and ramp comparator 1 have settled and are ready to begin a new operation. It is assumed here that these circuits have settled by the beginning of waveform repetition i+1 and when the rising edge of the waveform pulse occurs, trigger circuit 13 again activates ramp generator 3 to generate another ramp signal to ramp comparator 1. During repetition i+1, however, the signal from staircase generator 4 to ramp comparator 1 is a level higher than the staircase signal during the prior waveform repetition. Thus, a longer time interval is required for the magnitude of the ramp signal to reach that of the new staircase signal. The signal generated by ramp comparator 1 to activate sampling pulse generator 5 is therfore delayed slightly during the occurrence of repetition i+1 with respect to the prior repetition. As a result, a new sampled point on repetition i+1 is obtained. This sampled point is shown in FIG. 2-6 on repetition i+1 and is closer to, but still ahead of, the leading edge of the delayed pulse.

The above operations are repeated with respect to a new point on each successful repetition of the waveform as shown in FIG. 2-6. The sampled points eventually span the duration of the waveform. The image produced by deflecting the CRT 12 beam in accordance with the sample magnitude is shown in FIG. 2-7.

DETAILED DESCRIPTION OF THE INVENTION

The block diagram of FIG. 3 discloses the essential elements of one illustrative sampling circuit which, in accordance with a feature of the invention, generates each of a plurality of different point samples of a repetitive waveform by comparing during successive waveform repetitions the magnitude of a point to a variable reference signal which is varied in a prescribed manner after each comparison. After the plural comparisons have been performed pertaining to a point, the reference signal represents the approximate magnitude of the point on the waveform and forms a sample thereof. Samples of the entire waveform are obtained by repeating the above comparison operations with respect to different points on the waveform during other repetitions thereof.

The illustrative embodiment of the invention disclosed in FIG. 3 also inherently has the capability of simultaneously producing digital samples of the magnitude of each sample point in addition to the analog samples formed by the reference signals. The digital samples each comprise the binary results of each of the successive comparisons pertaining to a point on the waveform. These results are rank-ordered according to prescribed weighted values to define the magnitude of the waveform point and may conveniently be transmitted, for example, to a distant site and there reconstructed into analog values.

Although the embodiment chosen in FIG. 3 to illustrate the invention is in the environment of a sampling oscilloscope, it is understood that there is no intention to so limit the invention. Indeed, the invention has many potential applications including instances involving slow-varying and recurring signals. One such application might be in closed-circuit television security monitoring.

Triggering circuitry 20 and 21 in the illustrative embodiment of FIG. 3 may be identical to that of conventional sampling circuits such as shown in FIG. 1. Trigger take-off circuit 20 extends the incoming input signal to a trigger circuit 21, which is adjusted as described with respect to FIG. 1 to activate a ramp generator 22 at a desired time relative to the input signal. The input signal is also extended from the trigger take-off 20 to a latching signal comparator 23, rather than to a sampling gate as in the conventional sampling circuits. A delay line 24 may be inserted between the trigger take-off 20 and signal comparator 23.

The ramp signal from ramp generator 22 is extended to one input of a ramp comparator 25; a staircase signal from staircase generator 26 is present on a second input of comparator 25. When the magnitude of the ramp signal equals that of the staircase generator, comparator 25 generates a sampling pulse on lead 27 to activate latching comparator 23. The circuitry of latch comparator 23 continually tracks the relative magnitude of the two input signals unitl it is activated by one edge of the sampling pulse and at that time its output is latched to a high or low state depending on the comparison of its input signal magnitudes.

As mentioned, one input to latching comparator 23 contains the input signal from trigger take-off 20 or delay line 24. The remaining input to latching comparator 23 contains an analog reference signal generated by digital-to-analog (D/A) converter 30 in conjunction with data stored in a register 31. Register 31 contains a plurality of binary storage locations sufficient in number to store each of the comparison results between the input signal and the reference signal for a prescribed number N of repetitions of the input waveform. Each comparison results in the storage of a "0" or "1" in successive stages of register 31 and the accumulated results of the comparisons at any time during the sampling process is outputted to converter 30 on leads 32.

Converter 30 converts the binary results stored in register 31 at any given time into the analog reference signal according to prescribed weighted values assigned to each of the storage locations in register 31. As comparisons are performed between the reference signal and the input waveform at a waveform point, the reference signal is adjusted by converter 30 in accordance with the accumulated comparison results to approach in steps the magnitude of the input waveform. After N comparisons are performed, the reference signal is an accurate reflection of the magnitude of the point within any desired resolution limited only by the number of stages provided in register 31 and converter 30 for comparison results.

When N comparisons have been obtained and stored by register 31, it generates a sample complete signal on lead 33. This signal controls staircase generator 26 to step to a new staircase level to define a new point on the input waveform. Register 31 also resets itself at this time to clear the stored results pertaining to the sampled waveform point and to initialize itself for storing the results of the next waveform point.

Since the sample complete signal controls the time at which staircase generator 26 steps to a new staircase level, it is understood that the staircase signal to ramp comparator 25 remains at the same level during the sampling process corresponding to one point until N comparisons are obtained corresponding to N repetitions of the input waveform. This causes ramp comparator 25 to generate a sampling pulse on lead 27 at the same relative point on each of the N repetitions of the waveform so that N comparisons may be obtained at that point to complete the sample. This is in contradistinction to the operation of the conventional sampling circuit of FIG. 1, in which a new point is sampled by analog means on each waveform repetition.

The performing of comparison operations on successive waveform repetitions to form a complete sample, rather than the complete analog sampling of a point per repetition, is what appears to render the invention effective for resolving wide-bandwidth waveforms in such a simple and economical manner. Whereas each sample in conventional techniques requires the storage of an analog signal, having virtually an infinite range of possible values, during the duration of a sampling pulse, each comparison operation of the inventive method generates only the limited information of two possible results. The comparison operation can be performed on the transition or edge of a sampling signal or pulse, rather than during its duration, and these considerations, in turn, appear to lead to wide-bandwidth resolution.

Figure 5:
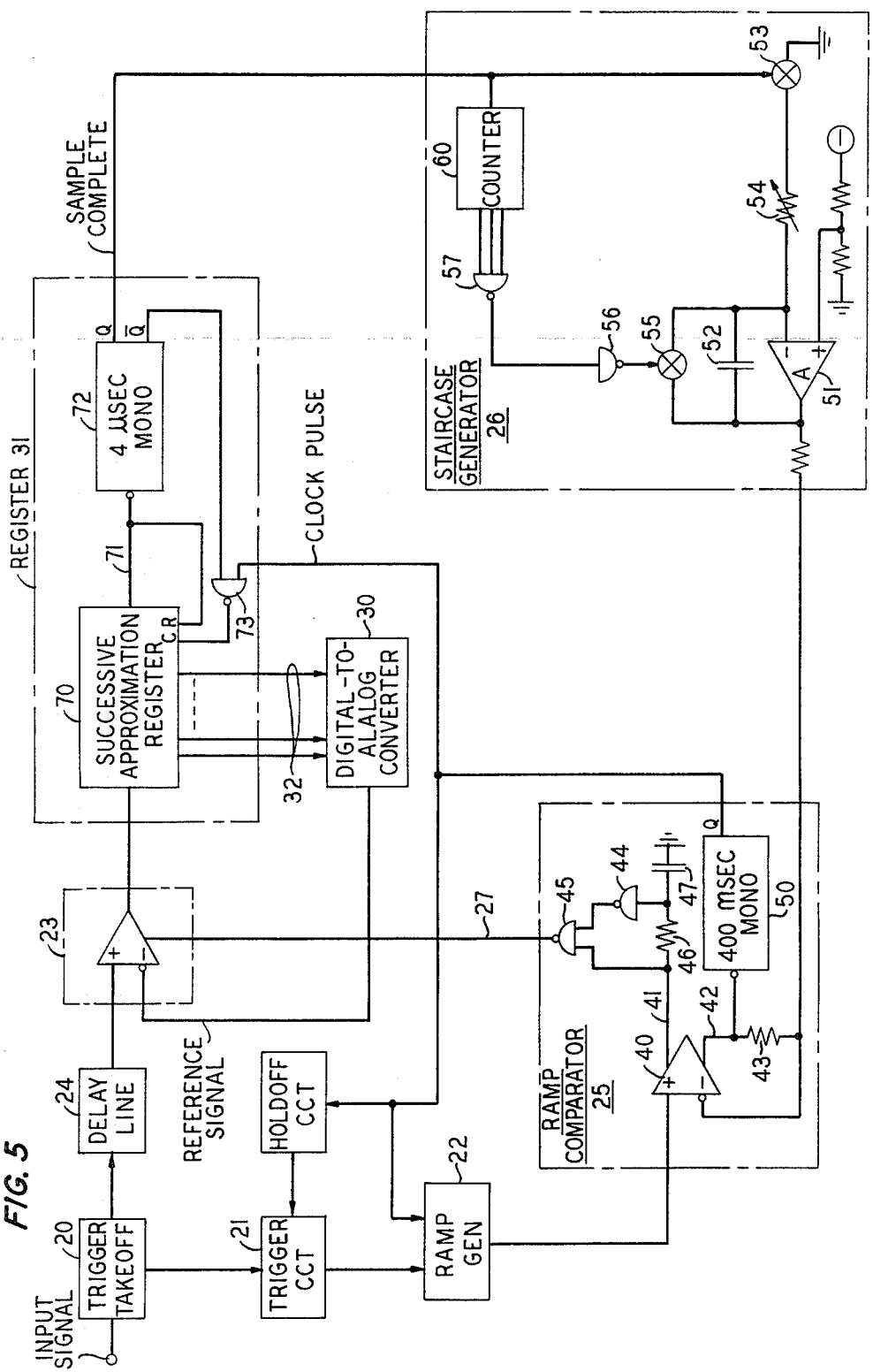
FIG. 5 discloses one detailed, exemplary embodiment of portions of the circuit of FIG. 3.

A better understanding of the circuit of FIG. 3 may be had by referring to FIG. 4, showing an illustrative set of signals present at various points in the circuit. FIG. 4-1 shows one input waveform that may be present at trigger take-off circuit 20. FIG. 4-2 shows trigger pulses produced by trigger circuit 21. These trigger pulses are illustratively chosen to occur at the initial rising edge of each repetitive input pulse. The ramp signals from ramp generator 22 are shown in FIG. 4-3; the sample complete signal generated after N comparisons at each sample point is shown in FIG. 4-4, and the staircase signal from staircase generator 26 is shown in FIG. 4-5.

Figure 6:
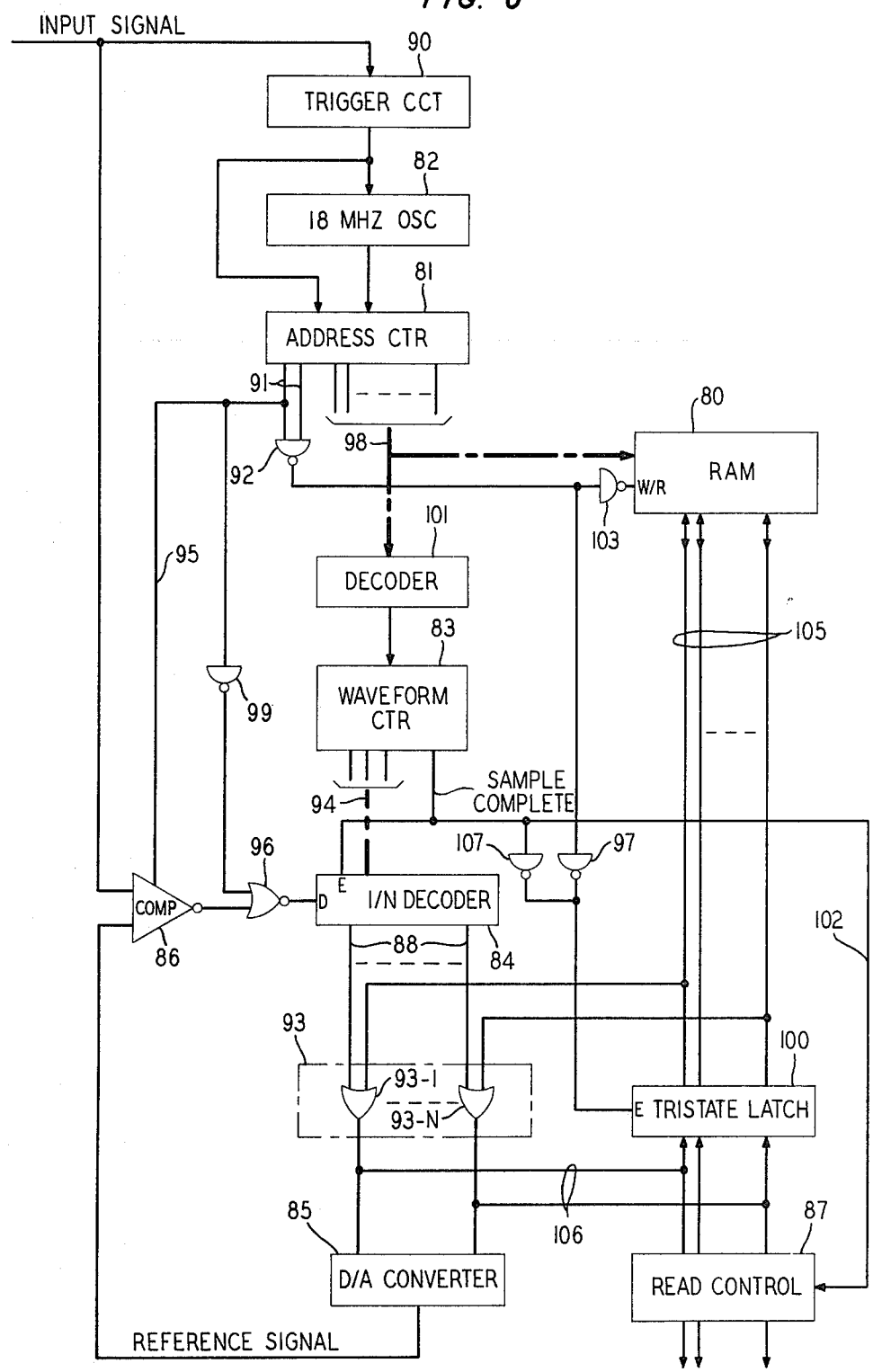
FIG. 6 discloses a block diagram of a circuit which, in accordance with another feature of the invention, performs a plurality of comparisons with respect to different points on each repetition or occurrence of a waveform.

As explained, each ramp signal persists until its magnitude equals that of the staircase signal, at which time ramp comparator 25 generates a signal to reset ramp generator 22 and to activate latching comparator 23. Sampling pulses produced on lead 27 by ramp comparator 25 are shown in FIG. 4-6. FIG. 4-7 shows the delayed input signal under the assumption that delay line 24 is included in the sampling circuit. FIG. 4-7 also shows the point on each successive repetition at which a comparison between the input signal and the reference signal is performed. FIG. 4-8 shows the relative values of the analog reference signal for the illustrative example of FIG. 4. FIG. 4-9 shows the vertical deflection signal that would be applied to CRT 36 in accordance with the samples obtained.

At the trigger point of waveform repetition p in FIG. 4-1, trigger circuit 21 produces a trigger pulse which causes ramp generator 22 to generate a ramp signal q as shown in FIG. 4-3. Initially, staircase generator 26 generates a staircase signal having a predetermined initial level, as shown in FIG. 4-5, set to be greater than the beginning level of the ramp signal. This guarantees an intersection of the ramp and staircase signals. When this intersection occurs, a sampling pulse is generated on lead 27 by comparator 25 and resets generator 22 to terminate the ramp signal. The sampling pulse also operates latching comparator 23 to compare the magnitude of the delayed input waveform in FIG. 4-7 to the magnitude of the reference signal. Initially, the reference signal magnitude is set to the midpoint of the range of the input signal, as will be seen. Latching comparator 23 produces a "1" output on activation if the magnitude of the input signal at the time of occurrence of the sampling pulse is greater than the magnitude of the reference signal, and a "0" if the input signal magnitude is less. In this case, the first comparison during repetition p results in a "1" since the magnitude of the delayed waveform at the sampled point is less than that of the reference signal. The "1" is stored in the first stage of register 31. This process is repeated on the succeeding N-1 repetitions of the waveform and the reference signal is adjusted after each comparison in progressive steps of $\frac{1}{2}$, $\frac{1}{4}$, $\frac{1}{8}$, etc., of the reference signal range in accordance with the accumulated comparison results in register 31. After a comparison has been performed on the Nth waveform repetition, register 31 generates the sample complete signal. This signal controls the stepping of the staircase signal to the next level preparatory to initiating the sampling of another point. At this time, the reference signal present on lead 34 represents the magnitude of the waveform at that point, within the desired resolution, and is applied to circuit 35 which, in turn, is controlled by the sample complete signal to control the deflection of the beam of CRT 36 accordingly. Register 31 is reset by the sample complete signal and the circuit is ready to operate on the next waveform point defined by the level of the staircase signal.

The above process is repeated on succeeding repetitions of the waveform as shown in FIG. 4 to produce a vertical deflection signal at CRT 36 shown by FIG. 4-9.

FIG. 5 shows a more detailed circuit drawing of the sampling circuit of FIG. 3. Ramp comparator 25 includes a signal comparing device 40, illustratively of a type manufactured by Advanced Micro Devices, Inc., of Sunnyvale, Calif. The ramp signal from ramp generator 22 is supplied to the positive terminal of device 40 and the staircase signal from generator 26 is supplied to the negative terminal. When the ramp and staircase signals are equal in magnitude, device 40 produces a positive-going voltage signal on its output lead 41 and a negative-going signal on its output lead 42. The negative signal is fed-back to the negative terminal of the device 40 by means of resistor 43 to aid the transition of the device into a more stable output state. The positive signal on lead 41 is applied to a network consisting of NAND gates 44 and 45, resistor 46 and capacitor 47. This network operates like a monostable circuit to generate a low-going sampling pulse on lead 27 of duration illustratively less than or equal to six nanoseconds. The reason for generating such a short sampling pulse is to prevent internal oscillations of latching comparator 23, which may tend to occur due to internal leakage capacitance when the input signal and reference signal to comparator 23 are approximately equal in magnitude. The signal on lead 42 from device 40 is also applied to monostable flip-flop 50, whose illustrative 400 nanosecond output pulse operates as a clock to control the operation of register 31. The 400 nanosecond delay allows the output of register 31 and converter 30 to stabilize before a new comparison operation is performed. Comparator 23 may comprise a comparing device such as the 685 comparator from Advanced Micro Devices, Inc.

Staircase generator 26 illustratively comprises a high impedance input operational amplifier 51 of conventional design, equipped with a feedback capacitor 52 which stores a voltage to define the level of the staircase signal to ramp comparator 25. The staircase level is stepped in response to the operation of switch 53, which causes capacitor 52 to charge to a higher voltage level through resistor 54 for the duration of operation of switch 53. Switch 53 may illustratively be a complementary metal oxide semiconductor (CMOS) switch, such as supplied by Radio Corporation of America (RCA). The switch is operated in response to sample complete signals from register 31. Another similar switch 55 is connected in parallel with stepping capacitor 52 and is used to discharge the capacitor when all samples of a waveform have been obtained to return the staircase level to the predetermined initial level. If 1000 samples of a waveform are desired, for example, to generate one satisfactory image of the waveform, switch 55 would be operated after each 1000 samples are obtained. To accomplish this, switch 55 is operated by a signal from NAND gate 56, which in turn is operated by NAND gate 57 responsive to a prescribed count state of counter 60. Counter 60 is incremented by sample complete signals from register 31 and the prescribed count state thereof is set equal to the number of samples to be taken to form a waveform image.

Register 31 illustratively comprises what is known in the art as a successive approximation register (SAR) 70, which may be a 2502 SAR, also manufactured by Advanced Micro Devices, Inc. The SAR operates in conjunction with converter 30 as follows. Assuming that SAR 70 is in an initial state, a "1" is preset in the first storage location thereof and the remaining storage locations are preset to "0". The states of these storage locations are applied to converter 30 on leads 32. Responsive to this initial state, converter 30, which may be a DAC-08 device manufactured by Advanced Micro Devices, Inc., converts the above states on leads 32 to an analog reference signal whose magnitude equals the midpoint of the range of magnitudes to be compared by latching comparator 23. The preset "1" controls converter 30 to generate this midpoint signal and the remaining "0s" cause no further contribution to the magnitude. The preset "1" in the first stage of SAR 70 is reset by latching comparator 23 if on the first comparison the magnitude of the input signal is less than the magnitude of the reference signal. The "1" is maintained if the magnitude of the input signal is greater than that of the reference signal. The clock pulse from ramp comparator 25 activates the operation in SAR 70 to either reset or maintain the preset "1" and also causes the next successive storage location in SAR 70 to be preset to "1". Responsive to this "1" and to the first comparison result now stored in the first location of SAR 70, converter 30 generates a new reference signal which is either $\frac{3}{4}$ or $\frac{1}{4}$ of the range of the magnitude to be compared, depending upon the state of the first storage location. This process of presetting the next successive stage of SAR 70 to vary the reference signal in anticipation of the next comparison continues until N comparison results have been stored. At this time the N+1th storage location of SAR 70 is preset and this generates a signal on lead 71. This signal is returned to the R input of SAR 70 preparatory to initializing it for taking another sample. The signal on lead 71 is also applied to a monostable flip-flop 72, which generates on its Q output the sample complete signal, illustratively a 4 microsecond pulse, to staircase generator 26. The low-going pulse on the $\overline{Q}$ output of monostable flip-flop 72 is applied to one input of NAND gate 73 to prevent any clock pulses from ramp generator 25 from activating SAR 70 for 4 microseconds. This prevents any operation of SAR 70 until the new staircase level from generator 26 has stabilized in response to the sample complete signal. SAR 70 is reinitialized on the occurrence of the next clock pulse from ramp comparator 25.

The remaining circuits of FIG. 5, including the trigger take-off 20, delay line 24, trigger circuit 21 and ramp generator 22 may be of conventional design and are similar to circuits such as disclosed in *Sampling Oscilloscope Circuits*, Tektronix, Inc. (1970). Alternatively, other types of conventional triggering circuits may be used.

It should be noted that although the circuit of FIGS. 3 and 5 incorporate a successive approximation register and weighted value digital-to-analog converter for producing the reference signal and comparison results, the invention is not so limited. Numerous alternatives within the spirit and scope of the invention may be devised for progressively forming an approximation of the magnitude of each of the waveform sample points. Many known techniques of analog-to-digital signal conversion are potentially applicable, such as for example, ramp counter, servo and tracking converter techniques as discussed in *Analog-Digital Conversion Handbook*, Analog Devices, Inc., Norwood, Mass. (1972). A ramp counter conversion technique combined with tracking might operate as follows. A ramp counter used to generate a reference signal is incremented at each comparison time so long as the reference signal is less than the magnitude of the sample point. Conversely, the counter is decremented as long as the reference signal magnitude is greater than that of the sample point. The starting magnitude of the reference signal for each successive sample point is the reference signal magnitude finally established for the immediately preceding sample point. Because of this tracking feature, a fewer number of waveform repetitions is required to form the sample of most of the points.

The circuit of FIG. 6 discloses another embodiment of the invention in which a plurality of comparisons, each with respect to a different point on a waveform, are obtained on each waveform repetition. For example, if 1000 samples are required to satisfactorily produce an image of a waveform, 1000 comparisons are obtained on each waveform repetition. Assuming, by way of example, that 8 bits are required to characterize each sample to a satisfactory degree of resolution, then at least 8 repetitions of the waveform are required in order to complete one set of samples describing the waveform. This embodiment may be used to advantage in sampling repetitive waveforms in which the signal content is slowly varying. Certain types of television signals, for example, have such a characteristic. A repetitive or slow-varying television signal waveform is defined the exemplary purposes only as the waveform that is associated with one complete image of a television screen, i.e., a plurality of scanned lines of the screen.

In FIG. 6 a random access memory (RAM) 80 is used to accumulate the data forming the samples of a waveform. Each word of RAM 80 contains a plurality of storage bit locations for storing the individual comparison results of each sample point. An address counter 81, which is driven by an oscillator 82, is used to access the individual words of RAM 80. An 18 megahertz (MHz) oscillator is chosen for illustration because it allows sampling of the waveform to occur at a 4.5 MHz rate in this exemplary embodiment. This in turn is sufficient to sample a slow-varying TV signal and obtain an acceptable level of resolution for many applications.

A single bit comparison result for each sample point on the waveform is obtained and stored in an appropriate word and bit location of RAM 80 on each waveform occurrence. A waveform occurrence counter 83 defines the bit position that is being formed during each waveform occurrence. Counter 83 controls a 1-out-of-N decoder 84, where N is the number of bits that form each complete sample, to output a signal on one of the N output leads 88 corresponding to the bit position being formed on the particular waveform occurrence in question. This signal together with the past comparison results stored in RAM 80 with respect to a sampled point are converted by digital-to-analog converter 85 into an analog reference signal which is compared by the input signal by comparator 86 to form the next comparison result at the point. The result is stored in RAM 80 in the appropriate word and bit position. After all samples have been completed, i.e., all comparison results are stored in RAM 80, a read control circuit 87 is activated to output the digital samples from RAM 80 to a utilization device (not shown) and to reset RAM 80 preparatory to performing another sampling operation.

This sampling circuit operates in more detail as follows. Assume that all circuits of FIG. 6 and the memory of RAM 80 are in an initial start state. Trigger circuit 90 illustratively operates at a prescribed time corresponding to the beginning of each waveform and responsive thereto activates oscillator 82 and resets address counter 81 to a zero count state. Address counter 81 is incremented responsive to the output pulses from oscillator 82. The outputs of the first two least significant counting stages of counter 81, identified as 91 in FIG. 6, define 4 phases of operation, 0 through 3, which control the comparison and storing operations for each point on the waveform. Initially, counter 81 begins at a zero count state which defines phase 0. In phase 0, the output of NAND gate 92 is high, which applies a low input to the write/read control input (W/R) of RAM 80 to place it in a read mode. The most significant outputs 98 of address counter 81, which are 0 at this time, define the word in RAM 80 which is to be read. During phase 0, RAM 80 applies the contents of the addressed word, which is assumed to be zero at this time, to circuit 93. Each storage location (one per comparison result) of word 0 is applied to a different one of the OR gates 93-1 to 93-N of circuit 93. Waveform counter 83 has all "0s" at its outputs 94 at this time. This state on leads 94 controls decoder 84 to generate a high output signal on its first output lead extending to OR gate 93-1. OR gate 93-1 thus has a high output signal and the remaining OR gates of circuit 93 have low output signals as a result of the initially reset state of the addressed word in RAM 80. The "1" signal applied to OR gate 93-1 controls converter 85 to generate an appropriate reference signal for the first comparison. As will be seen, this "1" signal is either maintained or reset to "0" before storage in RAM 80 in accordance with the result of comparison. By the time phase 1 occurs responsive to the next pulse from oscillator 82 to address counter 81, the output of the OR gates of circuit 93 have stabilized. These output states from circuit 93 are applied to digital-to-analog converter 85 and cause it to generate a reference signal which is approximately at the midpoint of the magnitude range of the input signal. The reference signal is applied to one input of latching comparator 86 and the input signal is applied to a second input of the comparator.

When phase 2 occurs, address counter 81 generates a sampling pulse on lead 95, which causes comparator 86 to latch to a high or low output state depending upon the relative magnitudes of the reference and input signals. The output of comparator 86 is applied to NOR gate 96. The second input of NOR gate 96 is connected to the most significant counting stage of waveform counter 83. This counter stage serves to generate a sample complete signal when N waveform occurrences have occurred. At the current time, this counting stage is reset, and this enables NOR gate 96 to pass the first comparison result to an enabling input (E) of decoder 84. In response, the high state from the first output of decoder 84 to OR gate 93-1 is maintained or reset to a low state in accordance with the value of the comparison result as mentioned above. Now when phase 3 occurs, the output of NAND gate 92 becomes low and renders the output of NAND gate 97 high to enable tristate latch 100. Tristate latch 100 is conventional and when not enabled, its outputs connected to leads 105 are essentially in a open, or high impedance, state. When enabled, however, its outputs acquire either "0" or "1" states, in accordance with the states applied to its inputs connected by means of leads 106 to the outputs of circuit 93. In response to the enabling of latch 100, its output leads assume the state of the output leads of circuit 93. The low output from gate 92 also renders the output of NAND gate 103 high to place RAM 80 in a write mode. The data now stored in latch 100 is written into RAM 80 at the address defined by the state of address leads 98 (which is currently address 0.)

At this point, one comparison result of the first sample point of the waveform has been obtained and stored in RAM 80. As address counter 81 is incremented, this process is repeated with respect to every other sample point during the first occurrence of the waveform. Decoder 101 detects the address of the last sample point when it occurs in address counter 81 and increments waveform counter 83 in response to a transition of address counter 81 out of that state. This, in turn, prepares the sampling circuit to perform operations pertaining to the second comparison operation for each of the sample points during the next occurrence of the waveform. Specifically, output signals of counter 83 appearing on leads 94 control one-out-of-N decoder 84 to generate a high signal on its second output lead to OR gate 93-2. This controls the adjustment of the reference signals for the comparison operations to follow on the second occurrence of the waveform pertaining to the second comparison result for each sample point. As discussed with respect to FIG. 3, the reference signal is adjusted prior to each second comparison to be ¾ or ¼ of the signal range, depending upon the first comparison results now stored in RAM 80.

The second comparison result for each sample point of the waveform is obtained and stored in the appropriate storage location in RAM 80, as described above for the first comparison result, and this process continues during subsequent waveform occurrences until N comparison results have been obtained and stored for each sample point. At this time, the sample complete signal from waveform counter 83 goes high and disables decoder 84 at its E input. This prevents decoder 84 from generating any output signals to OR gate circuit 93. The sample complete signal also activates read control circuit 87 by means of lead 102. This sample complete signal is also applied through NAND gate 107 to force the enable control lead E of tristate latch 100 low. This maintains the output leads of latch 100 in the high impedance, or open, state. During the next pass of address counter 81 through all of its addresses, the contents stored at the corresponding locations in RAM 80 are read-out to read control circuit 87 and reset to prepare for taking another set of samples. More specifically, during phases 0 to 2 associated with each address, as defined by the count states on leads 91, NAND gate 92 and 103 place RAM 80 in a read mode. The contents of the location addressed are read-out and applied to OR gates 93-1 to 93-N via leads 105. From the OR gates, the signals are applied to read control circuit 87 via leads 106. The presence of decoder 84 and latch 100 have no effect on the data on leads 105 and 106 since decoder 84 is deactivated by a signal at its E input from waveform counter 83, and latch 100 is deactivated by a low signal at its E input from NAND gate 107.

During phase 3 associated with each address from address counter 81, NAND gates 92 and 103 place RAM 80 into a write mode. At this time, the open output state of latch 100 causes "0s" to be written into the storage locations of RAM 80 at the address defined by address counter 81.

The above reading and initializing process continues until all data from RAM 80 has been given to read control circuit 87. Waveform counter 83 is then recycled by an incrementing pulse from decoder 101 and the circuit proceeds to repeat the sampling operations above described on the succeeding ocurrences of the waveform.

It is to be understood that the above-described arrangement is merely illustrative of the application of the principles of the invention, and that other arrangements may be devised by those skilled in the art without departing from the spirit and scope of the invention.

We claim:

1. A method of generating a representation of a repetitive electrical waveform by sampling the magnitude of a plurality of points on the waveform, said method being characterized by the steps of
   generating an approximation of the magnitude of a prescribed waveform point during each of a prescribed number of successive repetitions of the waveform using the most recently generated approximation to generate the next successive approximation, and
   repeating the above step with respect to a plurality of other points spanning the waveform.

2. The method of claim 1 wherein the generating step comprises
   comparing the magnitude of the waveform at a waveform point to the magnitude of a reference signal associated with said point on each one of said successive repetitions, and
   adjusting the magnitude of the reference signal in a prescribed manner after each comparison of the magnitude of the reference signal with the magnitude of the waveform point.

3. In a method of generating a representation of a repetitive electrical waveform by sampling the magnitude of a plurality of points on the waveform, said method being characterized by the steps of
   comparing during each of a plurality of repetitions of the waveform, the magnitude of the waveform at each of the waveform points to the magnitude of an associated one of a like plurality of reference signals, and
   adjusting the magnitude of each reference signal after each comparison of the reference signal with its associated waveform point in accordance with the result of the comparison.

4. The method of claim 3 wherein the reference signal adjusting step is characterized by the steps of
   successively accumulating a group of binary indications for each said waveform point, wherein each indication represents a result of comparison of the magnitude of one of the reference signals with the magnitude of its associated point, and
   converting the indications accumulated in each said group into said one reference signal according to prescribed weighted values assigned to each indication.

5. The method of claim 3 wherein said comparing step is characterized by the step of
   generating a plurality of sampling pulses during each repetition of the waveform to define said plurality of waveform points.

6. A method of producing a digitized representation of a repetitive electrical waveform, comprising the steps of
comparing the magnitude of a prescribed waveform point on each of a prescribed number of successive repetitions of the waveform to a reference signal whose magnitude is adjusted after each comparison in a prescribed manner in accordance with the results of the preceding comparisons of said prescribed point,
storing the result of each comparison operation associated with said point, thereby to form a binary number indicating the magnitude of said point, and
repeating the above steps with respect to other prescribed points spanning the waveform on successive repetitions of the waveform.

7. In a circuit for generating a representation of a repetitive electrical waveform, means for sampling the magnitude of a plurality of prescribed points on the waveform, said sampling means being characterized by
means (FIG. 5-23, 30, 31) for generating an approximation of the magnitude of a prescribed waveform point during each of a prescribed number of successive repetitions of the waveform using the most recently generated approximation to generate the next successive approximation, and
means (25, 26) for repeating the above step with respect to a plurality of other points spanning the waveform.

8. The invention of claim 7 wherein said approximation generating means comprises reference signal generating means (30),
means (23) for comparing the magnitude of the waveform at a said waveform point to the magnitude of a reference signal from said reference signal generating means, and
means (70) for adjusting the magnitude of the reference signal in a prescribed manner after each comparison of the magnitude of the reference signal with the magnitude of the waveform point.

9. In a circuit for generating a representation of a repetitive electrical waveform, means for sampling the magnitude of a plurality of points on the waveform, said sampling means being characterized by
means (FIG. 6-81, 82, 86, 90) for comparing during each of a plurality of repetitions of the waveform the magnitude of the waveform at each of the waveform points to the magnitude of an associated one of a like plurality of reference signals, and
means (80, 84, 85, 93) for adjusting the magnitude of each reference signal after each comparison of the reference signal with its associated waveform point in accordance with the result of the comparison.

10. The invention of claim 9 wherein the reference signal adjusting means comprises
means (80) for successively accumulating a group of binary indications for each said waveform point, wherein each indication represents a result of comparison of the magnitude of the reference signal with the magnitude of its associated waveform point, and
means (85) for converting the indications accumulated in each said group into the reference signal associated with a respective one of the points according to prescribed weighted values assigned to each indication.

11. The invention of claim 9 wherein said comparing means comprises
means (81, 82) for generating a plurality of sampling pulses during each repetition of the waveform to define said plurality of waveform points.

12. In a circuit for generating a representation of a repetition electrical waveform, means for sampling the magnitude of the waveform at a plurality of points across the waveform, said sampling means being characterized by
means (FIG. 5-23, 25) for comparing the magnitude of the waveform at a first point on each repetition of a group of one or more successive repetitions of the waveform to the magnitude of an adjustable reference signal initially set to a predetermined magnitude,
means (30, 31) for adjusting the magnitude of the reference signal in a prescribed manner in accordance with the results of each comparison to approach within a predetermined amount the magnitude of the waveform at the first waveform point, wherein the number of repetitions in each individual group of repetitions is determined by the number of repetitions required to attain said predetermined amount, and
means (22, 26) for controlling the comparing means to operate with respect to a different point on the waveform during each successive group of successive repetitions of the waveform.

13. The invention of claim 12 wherein said controlling means is responsive to the occurrence of each waveform repetition for delaying the operation of said comparing means until the occurrence of a said point on the waveform being sampled, and is characterized by
first means (51, 52, 53, 54) responsive to the reference signal adjusting means for generating a staircase signal having a plurality of signal magnitude levels, each level spanning one group of waveform repetitions.

14. The invention of claim 13 wherein said first means for generating comprises
second means (55, 56, 57, 60) for generating a predetermined number of said signal magnitude levels each defining one of said points on the waveform.

15. The invention of claim 13 wherein said controlling means further comprises
means (21) responsive to each repetition of the waveform for generating a trigger signal,
means (22) responsive to said trigger signal for generating a ramp signal, and
means (25) for comparing the magnitude of said ramp signal to the magnitude of one of said signal magnitude levels, and said first generating means comprises
second means (53) for controlling each said signal magnitude level to span a said group of successive waveform repetitions.

16. The invention of claim 12 wherein said reference signal adjusting means comprises
means (70) for storing an individual indication of the result of each said operation of said comparing means.

17. The invention of claim 16 wherein said reference signal adjusting means further comprises
means (30) for converting said individual result indications into said reference signal according to prescribed weighted values assigned to each of the individual stored result indications.

18. The invention of claim 16 wherein said storing means comprises means (72) for transmitting a sample complete signal to said controlling means after the occurrence of each said group of waveform repetitions.

19. The invention of claim 18 wherein said controlling means comprises means (55, 56, 57, 60) responsive to the receipt of a prescribed number of said sample complete signals for reinitializing said first generating means to a prescribed beginning state.

* * * * *